United States Patent
Taylor et al.

(10) Patent No.: US 10,056,733 B1
(45) Date of Patent: Aug. 21, 2018

(54) WAVELENGTH LOCKER INTEGRATED WITH A SILICON PHOTONICS SYSTEM

(71) Applicant: INPHI CORPORATION, Santa Clara, CA (US)

(72) Inventors: Brian Taylor, Santa Clara, CA (US); Radhakrishnan L. Nagarajan, Santa Clara, CA (US); Masaki Kato, Palo Alto, CA (US)

(73) Assignee: INPHI CORPORATION, Santa Clara, CA (US)

( * ) Notice: Subject to any disclaimer, the term of this patent is extended or adjusted under 35 U.S.C. 154(b) by 0 days.

(21) Appl. No.: 15/453,618

(22) Filed: Mar. 8, 2017

(51) Int. Cl.
| | |
|---|---|
| H04J 14/02 | (2006.01) |
| H01S 5/0687 | (2006.01) |
| G02B 6/28 | (2006.01) |
| G02B 6/42 | (2006.01) |
| H01S 5/12 | (2006.01) |
| G02B 6/125 | (2006.01) |
| H04B 10/50 | (2013.01) |
| G02B 6/12 | (2006.01) |

(52) U.S. Cl.
CPC .......... *H01S 5/0687* (2013.01); *G02B 6/125* (2013.01); *G02B 6/2813* (2013.01); *G02B 6/2861* (2013.01); *G02B 6/4286* (2013.01); *H01S 5/12* (2013.01); *H04B 10/5057* (2013.01); *H04J 14/02* (2013.01); *G02B 2006/1215* (2013.01); *G02B 2006/12135* (2013.01)

(58) Field of Classification Search
CPC .......... H01S 5/0687; H01S 5/12; H04J 14/02; H04B 10/5057; G02B 6/2861; G02B 6/4286; G02B 6/2813; G02B 6/125; G02B 2006/12135; G02B 2006/1215
USPC .......................................................... 398/79
See application file for complete search history.

(56) References Cited

U.S. PATENT DOCUMENTS

| | | | |
|---|---|---|---|
| 2011/0305464 A1* | 12/2011 | Goldfarb .......... | H04B 10/50597 398/208 |
| 2014/0328584 A1* | 11/2014 | Sun .................... | H04B 10/6165 398/25 |
| 2017/0195062 A1* | 7/2017 | Evans .................. | H04B 10/616 |

* cited by examiner

*Primary Examiner* — Juan A Torres
(74) *Attorney, Agent, or Firm* — Richard T. Ogawa; Ogawa P.C.

(57) ABSTRACT

A wavelength locker integrated with a silicon photonics transmission system comprising a silicon-on-insulator (SOI) substrate and an input via a power tap coupler to receive a fraction of a transmission signal with one or more frequencies from a primary output path of the silicon photonics transmission system. The wavelength locker further includes a splitter configured to split the input to a first signal in a first path and a second signal in a second path and a first delay-line-interferometer (DLI) coupled to the second path to receive the second signal and configured to generate an interference spectrum and output at least two sub-spectrums tunable to keep quadrature points of the sub-spectrums at respective one or more target frequencies. The wavelength locker is configured to generate an error signal fed back to the silicon photonics transmission system for locking the one or more frequencies at the one or more target frequencies.

22 Claims, 5 Drawing Sheets

$$Err = \frac{Wl_{bar} - Wl_{cross}}{Wl_{bar} + Wl_{cross}}$$

WAVELENGTH LOCKER INTEGRATED WITH A SILICON PHOTONICS SYSTEM

CROSS-REFERENCE TO RELATED APPLICATIONS

N/A

BACKGROUND OF THE INVENTION

The present invention relates to optical telecommunication techniques. More particularly, the present invention provides a wavelength locker integrated in silicon photonics transmission system.

Over the last few decades, the use of communication networks exploded. In the early days Internet, popular applications were limited to emails, bulletin board, and mostly informational and text-based web page surfing, and the amount of data transferred was usually relatively small. Today, Internet and mobile applications demand a huge amount of bandwidth for transferring photo, video, music, and other multimedia files. For example, a social network like Facebook processes more than 500 TB of data daily. With such high demands on data and data transfer, existing data communication systems need to be improved to address these needs.

Progress in computer technology (and the continuation of Moore's Law) is becoming increasingly dependent on faster data transfer between and within microchips. Optical interconnects may provide a way forward, and silicon photonics may prove particularly useful, once integrated on the standard silicon chips. 40-Gbit/s and then 100-Gbit/s data rates WDM optical transmission over existing single-mode fiber is a target for the next generation of fiber-optic communication networks. The big hangup so far has been the fiber impairments like chromatic dispersion that are slowing the communication signal down. Everything is okay up to 10 Gbits/s plus a little, but beyond that, distortion and attenuation take their toll. Many approaches are proposed on modulation methods for transmitting two or more bits per symbol so that higher communication rates can be achieved. Beyond the light modulation for data transmission, the MUX/DEMUX of light signals is another one of essential building blocks for the optical communication network. All these network building blocks integrated on silicon chips as silicon photonic devices have many advantages over conventional stand-alone optical and electrical devices.

In particular, silicon photonic devices have been applied in dense-wavelength-division multiplexing (DWDM) optical transmission networks, in which DEMUX/MUX of light signals require precise wavelength targeting and control over environment temperature change. Therefore, improved silicon photonics wavelength locking techniques and devices are desired.

BRIEF SUMMARY OF THE INVENTION

The present invention relates to optical telecommunication techniques. More particularly, the present invention provides a wavelength locker integrated in silicon photonics transmission system. Merely by examples, the present invention discloses several configurations of wavelength locker based on delay-line-interferometer (DLI) that is integrated with a silicon photonic transmission system-on-chip on a silicon-on-insulator substrate for high data rate DWDM optical communications, though other applications are possible.

In modern electrical interconnect systems, high-speed serial links have replaced parallel data buses, and serial link speed is rapidly increasing due to the evolution of CMOS technology. Internet bandwidth doubles almost every two years following Moore's Law. But Moore's Law is coming to an end in the next decade. Standard CMOS silicon transistors will stop scaling around 5 nm. And the internet bandwidth increasing due to process scaling will plateau. But Internet and mobile applications continuously demand a huge amount of bandwidth for transferring photo, video, music, and other multimedia files. This disclosure describes techniques and methods to improve the communication bandwidth beyond Moore's law.

In an embodiment, the present invention provides a wavelength locker integrated with a silicon photonics transmission system. The wavelength locker includes a silicon-on-insulator (SOI) substrate on which the silicon photonics transmission system is formed. Further, the wavelength locker includes a power tap coupler to receive a fraction of a transmission signal from the silicon photonics transmission system as an input signal with one or more frequencies. Additionally, the wavelength locker includes a splitter configured to split the input signal to a first signal in a first path and a second signal in a second path. The wavelength locker further includes a first delay-line-interferometer (DLI) coupled to the second path to receive the second signal and configured to generate an interference spectrum and output a first sub-spectrum and a second sub-spectrum shifted in frequency domain by half of a free-spectral-range to form a plurality of quadrature points at respective one or more target frequencies. Furthermore, the wavelength locker includes a first detector coupled to the first path for detecting a reference power of the first signal and a second detector and a third detector for respectively detecting a first power of the first sub-spectrum and a second power of the second sub-spectrum depended on frequency to generate an error signal fed back to the silicon photonics transmission system for locking the one or more frequencies at corresponding one or more target frequencies.

In an alternative embodiment, the present invention provides a silicon photonics transmission system including one or more DFB lasers to output a transmission signal to an output port, a power tap coupler coupled to the output port to provide a primary output path for outputting the transmission signal and a secondary path for providing a fraction of the transmission signal as an input signal of a wavelength locker for locking corresponding laser frequency of each of the one or more DFB lasers to a respective target frequency. The wavelength locker includes a splitter configured to split the input to a first signal in a first path and a second signal in a second path. Furthermore, the wavelength locker includes a first delay-line-interferometer (DLI) coupled to the second path to receive the second signal and configured to generate an interference spectrum and to output at least two sub-spectrums having a relative phase shift tunable to keep a plurality of quadrature points of the two sub-spectrums at respective target frequencies selected from a set of channels. Moreover, the wavelength locker includes a first detector coupled to the first path for detecting the first signal as a reference and one or more second detectors for detecting powers of the at least two sub-spectrums varying with frequency to generate a differential error signal fed back to the silicon photonics transmission system for locking the one or more frequencies respectively at corresponding target frequencies selected from the set of channels. Optionally, the set of channels is DWDM channels of ITU grid. Optionally, the set of channels has a channel spacing of 100 GHz, or 50 GHz, or 25 GHz. Optionally, the set of channels is a set of gridless channels.

The present invention achieves these benefits and others in the context of known silicon waveguide laser communication technology. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION OF THE INVENTION

Figure 1:
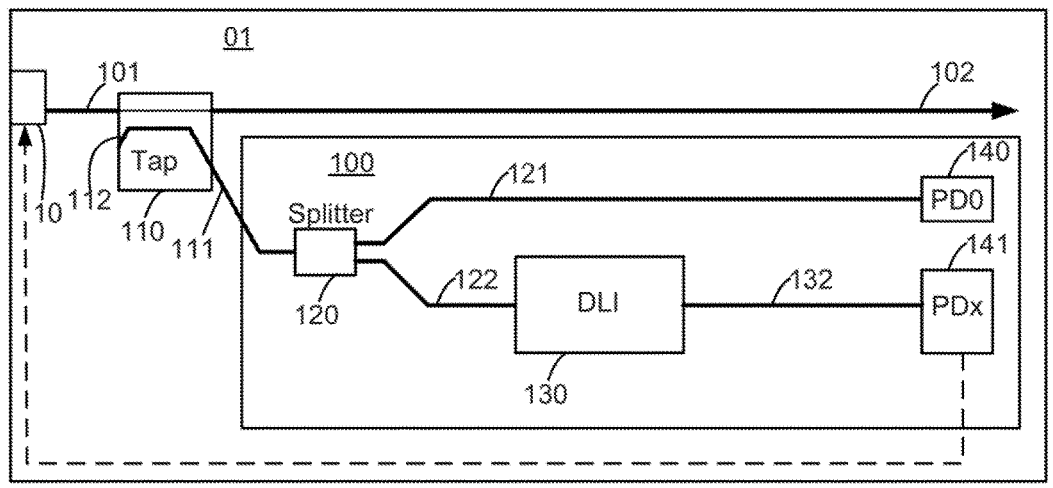
FIG. 1 is a simplified diagram of a wavelength locker integrated in a silicon photonics system-on-chip according to some embodiments of the present invention.

The present invention relates to optical telecommunication techniques. More particularly, the present invention provides a wavelength locker integrated in silicon photonics transmission system. Merely by examples, the present invention discloses several configurations of wavelength locker based on delay-line-interferometer (DLI) that is integrated with a silicon photonic transmission system-on-chip on a silicon-on-insulator (SOI) substrate for high data rate DWDM optical communications, though other applications are possible.

In the last decades, with advent of cloud computing and data center, the needs for network servers have evolved. For example, the three-level configuration that have been used for a long time is no longer adequate or suitable, as distributed applications require flatter network architectures, where server virtualization that allows servers to operate in parallel. For example, multiple servers can be used together to perform a requested task. For multiple servers to work in parallel, it is often imperative for them to be share large amount of information among themselves quickly, as opposed to having data going back forth through multiple layers of network architecture (e.g., network switches, etc.).

Leaf-spine type of network architecture is provided to better allow servers to work in parallel and move data quickly among servers, offering high bandwidth and low latencies. Typically, a leaf-spine network architecture uses a top-of-rack switch that can directly access into server nodes and links back to a set of non-blocking spine switches that have enough bandwidth to allow for clusters of servers to be linked to one another and share large amount of data.

In a typical leaf-spine network today, gigabits of data are shared among servers. In certain network architectures, network servers on the same level have certain peer links for data sharing. Unfortunately, the bandwidth for this type of set up is often inadequate. It is to be appreciated that embodiments of the present invention utilizes PAM (e.g., PAM4, PAM8, PAM12, PAM16, etc.) in leaf-spine architecture that allows large amount (up terabytes of data at the spine level) of data to be transferred via optical network.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

FIG. 1 is a simplified diagram of a wavelength locker integrated with a silicon photonics system-on-chip according to some embodiments of the present invention. This diagram is merely an example, which should not unduly limit the scope of the claims. One of ordinary skill in the art would recognize many variations, alternatives, and modifications. As shown schematically in FIG. 1, the wavelength locker 100 is integrated with a silicon-photonics system-on-chip 10 formed on a silicon-on-insulator (SOI) substrate 01. The silicon-photonics system-on-chip 10 is a transmission system having an output port 101. A power tap coupler 110 is a coupled to the output port 101 to provide a primary output path 102 for outputting a transmission signal and a secondary tap path 111 taking a fraction of the transmission signal as an input signal 111 of the wavelength locker 100. Optionally, the power tap coupler includes a cross tap port 112 configured to receive a tapped signal travelling in reverse direction from the primary output path 102. Optionally, the power tap coupler 110 is a waveguide device formed on the same SOI substrate 01. Optionally, the transmission signal can be multiplexed from one or more frequencies generated respectively by one or more DFB lasers coupled to the silicon photonics transmission system 10.

In an embodiment, the wavelength locker 100 includes a splitter 120 configured to split the input signal 111 into two paths with two signals in substantially equal power. A first signal carries substantially half power of the input signal with the one or more frequencies into a first path 121 which is terminated by a detector PD0 140 and a second signal carries substantially half power of the input signal with the one or more frequencies into a second path 122 into a delay-line interferometer (DLI) 130. The DLI 130 is configured to process the second signal to generate an interference spectrum and output at least two sub-spectrums with a phase shift associated with a free-spectral range of the DLI 130 respectively to at least two signal paths 132. More detectors PDx 141 are used to detect powers in the at least two signal paths 132 respectively, based on which a feedback signal can be sent to the silicon photonics transmission system 10 for adjusting the corresponding one or more laser frequencies back to target frequencies.

Figure 2:
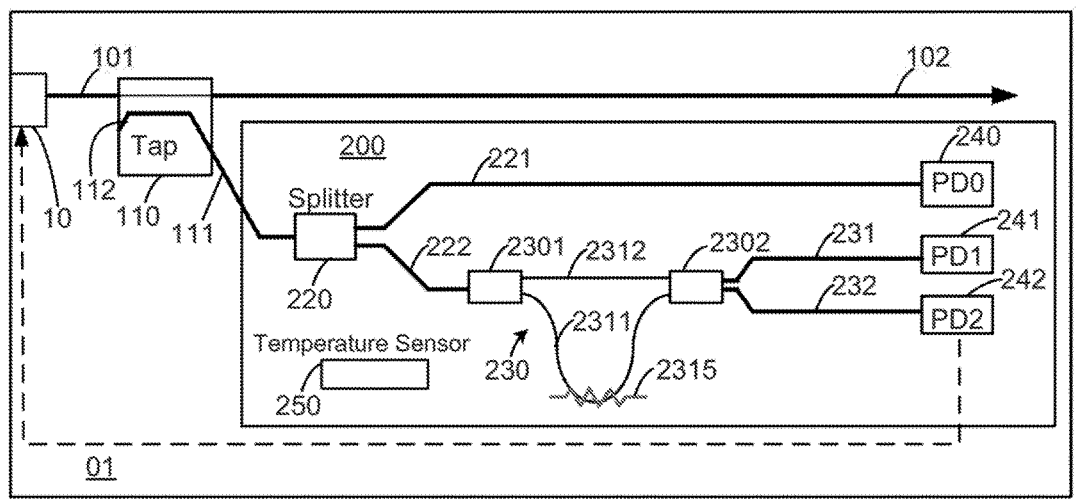
FIG. 2 is a simplified diagram of the wavelength locker of FIG. 1 including one delay-line-interferometer (DLI) outputting two phase-shifted interference sub-spectrums according to an embodiment of the present invention.

FIG. 2 is a simplified diagram of the wavelength locker of FIG. 1 including one delay-line-interferometer (DLI) outputting two phase-shifted interference sub-spectrums according to an embodiment of the present invention. This diagram is merely an example, which should not unduly limit the scope of the claims. One of ordinary skill in the art would recognize many variations, alternatives, and modifications. As a specific embodiment, the wavelength locker 200 includes a splitter 220 configured as a 1×2 power splitter to receive an input signal 111, a fraction of the transmission signal, and split into a first signal in a first path 221 and a second signal in a second path 222 with substantial equal intensity. Both the first signal and the second signal carry the one or more frequencies in the original transmission signal directly from the one or more DFB lasers, which are the subject frequencies to be locked by the wavelength locker 200 according to the present disclosure. The first path 221 is terminated by a photodiode PD0 240 for converting light intensity of the first signal to a PD current, serving as a reference. Additionally, the second signal is guided to a MMI coupler 2301 of a waveguide-based DLI 230.

The DLI 230 is a Mach-Zehnder interferometer having two waveguide arms: a first arm 2311 and a second waveguide arm 2312, to receive two equal-intensity waves of the second signal respectively. The first arm 2311 is selected to be longer in length than the second arm 2312 to create a phase delay in the first arm 2311 due to the length difference. The phase delay induces an interference spectrum as the two waves are recombined after respectively traveling through the two waveguide arms. The interference spectrum is characterized by a free-spectral range $FSR=c/(n_g \Delta L)$ represented by a spacing between two neighboring peaks along the frequency axis, where $n_g$ is group index of the waveguide material and $\Delta L$ is the length difference. Optionally, the two recombined waves interfere each other constructively or destructively after they are recombined at another 2×2 MMI coupler 2302, converting a phase-keyed signal into an amplitude-keyed signal. The 2×2 MMI coupler 2302 is configured to output a first sub-spectrum representing half-powered interference spectrum into a first signal path and a second sub-spectrum representing same half-powered interference spectrum but with a shifted phase of $\pi$ in frequency domain (see FIG. 4).

For the case that the transmission signal carrying one or more frequencies that are supposed to be locked at the one or more target frequencies, the DLI 230 can be configured, by tuning its phase delay, to set the FSR to be equal to 2× (or twice) of the difference between the two neighboring target frequencies of a set of channels in certain grid with a fixed channel spacing. Choosing the FSR to be 2× the channel spacing allows the wavelength locker 200 to be kept in a smallest size, reducing chip area needed for manufacturing the silicon waveguide-based wavelength locker. Optionally, each target frequency can be chosen from one of a plurality of quadrature points of the two interference sub-spectrums having a relative phase shift of $\pi$ crossing each other. At each quadrature point intensity of the first sub-spectrum (solid curve in FIG. 4) varies with frequency in a negative slope and intensity of the second sub-spectrum (dotted curve in FIG. 4) varies with frequency in a positive slope. Whenever one of the one or more frequencies of the transmission signal is off the target frequency, the two intensities of the first and the second sub-spectrum will change in opposite direction, resulting a simply sign flip of a difference between the two intensities. Conversely, the quadrature point frequency can be conveniently used as target frequency at which the corresponding transmission signal frequency is aimed to lock by the wavelength locker. Additionally, two nearest quadrature points that are used as target frequencies can be just two nearest channels for transmission. For example, the channels for transmission are DWDM channels of ITU grid. The difference between the two quadrature-point frequencies is just the channel spacing of the ITU grid, such as 100 GHz, 50 GHz, or 25 GHz.

Figure 4:
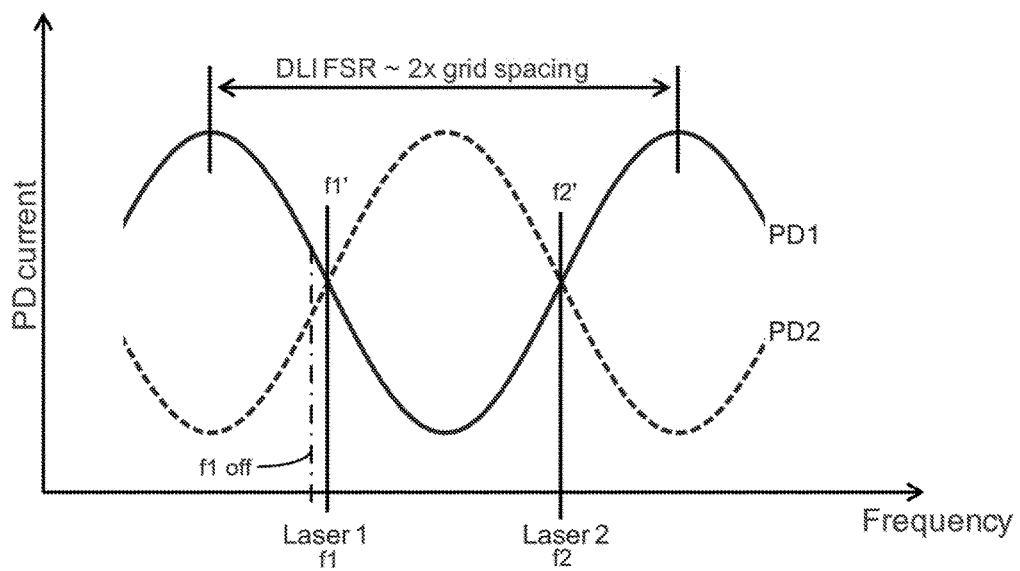
FIG. 4 is a plot of two normalized PD currents representing two phase-shifted interference sub-spectrums of the DLI in frequency domain according to an embodiment of the present invention.

Referring to FIG. 2, for example, the input signal 111 tapped from the primary output path carries two frequencies at f1 and f2 generated from two lasers of the silicon photonics transmission system 10. After the input signal 111 being split to two halves, the first signal 221 and the second signal 222, the second signal 222 is further split by the 1×2 MMI coupler 2301 into two waves respectively passed into two waveguide arms of the DLI 230. The 2×2 MMI coupler 2302 recombines the two waves to generate the interference spectrum and outputs the first sub-spectrum to a first signal path 231 and the second sub-spectrum to a second signal path 232 having a phase shift of 180° degrees. Each signal path is independently terminated by a photodiode: PD1 241 for measuring signal intensity of the first sub-spectrum in the first signal path 231 in terms of a first PD current and PD2 242 for measuring signal intensity of the second sub-spectrum in the second signal path 232 in terms of a second PD current. In an embodiment, either the first PD current or the second PD current is normalized by the reference current obtained by PD0 240 (by measuring the signal intensity in the first path 221) to eliminate the possible power fluctuation entering the two waveguide arms of the DLI 230. As shown in FIG. 4, the two normalized PD currents representing two phase-shifted interference sub-spectrum waves of the DLI are plotted in frequency domain. Both interference sub-spectrums are sine waves interleaved to each other with same normalized amplitude and a same period equal to the FSR of the DLI 230 and a plurality of quadrature points equally distributed along the frequency axis as the two interference sub-spectrums crosses each other. A quadrature point is an intersection of the two sine waves along a frequency axis respectively at two target frequencies f1' and f2', e.g., two DWDM narrow-band channel frequencies in ITU grid. By design, two DFB lasers associated with the silicon photonics transmission system 10 generates light at two frequencies f1 and f2 at the two DWDM channels multiplexed into a single transmission signal. In other words, the wavelength locker 200 is provided to tune the two laser frequencies f1 and f2 to the two target channel frequencies, i.e., to lock f1=f1' and f2=f2'. Optionally, the target frequencies can be two or more gridless channels having a channel spacing.

Figures 7, 8:
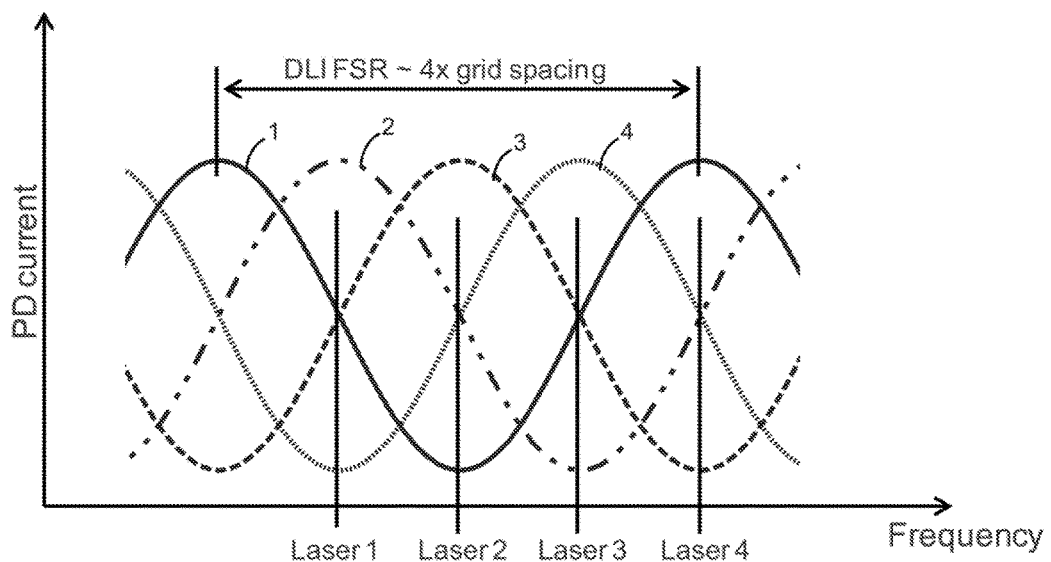
FIG. 7 is a plot of four normalized PD currents representing four phase-shifted interference sub-spectrums of the DLI in frequency domain according to an embodiment of the present invention.
FIG. 8 is formula of an error signal generated from two PD currents measured from two interference sub-spectrums by the wavelength locker.

The locking of the laser frequency can be achieved using an error signal generated by the first PD current and the second PD current as a feedback signal for the corresponding laser diode. FIG. 8 is a formula of the error signal generated from two PD currents measured from the two interference sub-spectrums outputted by the 2×2 MMI coupler of the wavelength locker. Referring back to FIG. 2, the first PD current in the first signal path 231 represents the intensity $W1_{bar}$ of the first sub-spectrum and the second PD current in the second signal path 232 represents the intensity $W1_{cross}$ of the second sub-spectrum. Ideally, referring to FIG. 8, both $W1_{bar}$ and $W1_{cross}$ should be equal to keep the error signal Err=0. As a differential signal, the sign of the error signal Err can also indicate which direction the target frequency is shifted off from the quadrature point. The error signal Err is fed back to the laser diode for tuning the laser frequency accordingly to lock the laser frequency (e.g. f1) back to the target frequency (e.g., f1'). For example, laser 1 frequency f1 is off by drifting to a lower frequency than the target frequency f1'. Then, the error signal Err records a positive value and suggests the laser frequency should be tuned in positive direction (increase from a present value f1) towards the target frequency f1'. In principle, any number of target frequencies can be assigned to respect quadrature points of the DLI interference spectrum that can be used for locking the any number of corresponding laser frequencies thereof.

Optionally, in order to control the quadrature points to be substantially fixed to the one or more target frequencies and to overcome possible temperature drift of these quadrature points, the DLI 230 also includes a resistive heater 2315, as shown in FIG. 2, disposed around the first arm 2311 for tuning the group index value to compensate the SFR drift due to environmental temperature change.

Optionally, the wavelength locker 200 includes a temperature sensor 250 disposed on the SOI substrate 01 for monitoring local temperature near the DLI 230 for guiding a tuning of the two-beam interference spectrum and calibrating the DLI 230 against thermal drift. Thus, the DLI 230 can be tuned and held more accurately at frequency grid to ensure the laser frequency be locked to the target frequency. The temperature sensor 250 can be used to calibrate the small but non-zero thermal drift of the DLI 230 over temperature.

Figure 3:
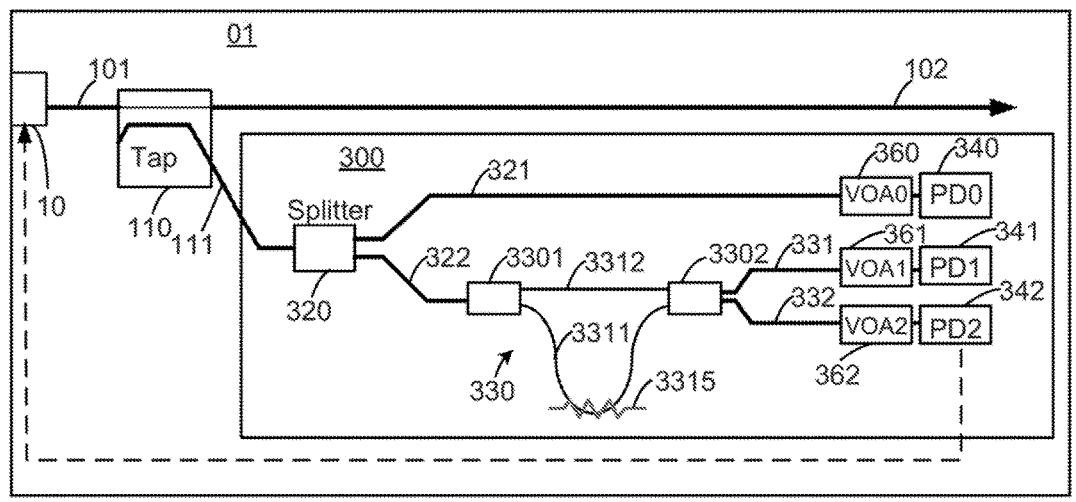
FIG. 3 is a simplified diagram of the wavelength locker of FIG. 1 including one DLI outputting two phase-shifted interference sub-spectrums according to another embodiment of the present invention.

FIG. 3 is a simplified diagram of the wavelength locker of FIG. 1 including one DLI outputting two phase-shifted interference sub-spectrums according to another embodiment of the present invention. This diagram is merely an example, which should not unduly limit the scope of the claims. One of ordinary skill in the art would recognize many variations, alternatives, and modifications. In some embodiments, due to device variation or other unknown factors, power splitting is uneven for the first path 321 and the second path 322 after the 1×2 power splitter 320. The wavelength locker 300, being substantially similar to the wavelength locker 200, further includes a variable optical attenuator (VOA) disposed to the first path. VOA0 360 in the first path 321 is for adjusting the signal intensity in the first path 321 before coupled to a photodiode PD0 340. The intensity adjustment by VOA is based on intensity measurement by the PD0 340 which defines the reference intensity for normalizing the processed signals by the DLI 330. Similarly, in two signal paths 331 and 332, two VOAs: VOA1 361 and VOA2 362, are respectively added for balancing the intensity of the two processed signals before being converted to PD currents by two photodiodes: PD1 341 and PD2 342, based on which an error signal can be obtained for adjusting the laser frequency to lock it at a target frequency. Similar to the wavelength locker 200 illustrated in FIG. 2, the DLI 330 includes an MMI coupler 3301, a 2×2 MMI coupler 3302, two waveguide arms 3311 and 3312, and a resistive heater 3315 that correspond to the MMI coupler 2301, the 2×2 MMI coupler 2302, the two waveguide arms 2311 and 2312, and the resistive heater 2315, respectively.

Figure 5:
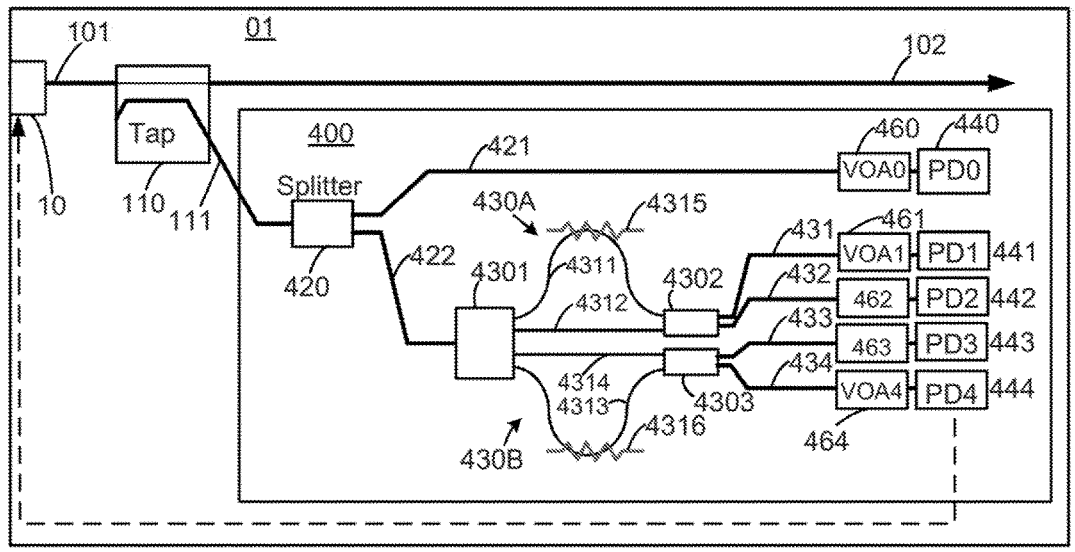
FIG. 5 is a simplified diagram of the wavelength locker including two DLIs totally outputting four phase-shifted interference sub-spectrums according to an embodiment of the present invention.

In some embodiments, the wavelength locker under a same operation principle can be extended for locking the transmission frequencies to target frequencies with finer channel spacing. FIG. 5 is a simplified diagram of the wavelength locker including two DLIs with four phase-shifted interference waves according to an embodiment of the present invention. This diagram is merely an example, which should not unduly limit the scope of the claims. One of ordinary skill in the art would recognize many variations, alternatives, and modifications. As shown, the wavelength locker 400 includes two waveguide-based DLIs 430A and 430B having a 1×4 MMI coupler 4301 to receive an input signal 422 carrying four laser frequencies generated by four laser diodes: Laser 1, Laser 2, Laser 3, and Laser 4, associated with a silicon photonics transmission system 10 formed on the SOI substrate 01. The input signal 422 is a second one of two paths split by a 1×2 power splitter 420 from a tapped signal 111 as a fraction of a transmission signal from a primary output path 102 of a silicon photonics transmission system 10 while the first one of the two paths carries a reference signal (equal to 50% of the input signal 422) and is terminated by a detector PD0 440 and optionally including a VOA0 460 for adjusting power.

Referring to FIG. 5, a first DLI 430A includes two waveguide arms, a first arm 4311 and a second arm 4312, from the output of the 1×4 MIMI coupler 4301 with the first arm 4311 being set to be longer than the second arm 4312 to create a phase delay between the two waves of the same frequency in the first arm and the second arm. The two waves are recombined at a 2×2 MMI coupler 4302 to generate a first interference spectrum. A second DLI 430B includes two waveguide arms, a third arm 4313 and a fourth arm 4314, from the output of the 1×4 MMI coupler 4301 with the third arm 4313 being set to be longer than the fourth arm 4314 to create a phase delay between the two waves of the same frequency in the third arm and the fourth arm. The two waves are recombined at another 2×2 MIMI coupler 4303 to generate a second interference spectrum. The 2×2 MIMI coupler 4302 outputs first two interference sub-spectrums associated with the first interference spectrum respectively into a first signal path 431 and a second signal path 432 having a relative phase shift of 180 degrees. The 2×2 MIMI coupler 4303 outputs second two interference sub-spectrums associated with the second interference spectrum respectively into a third signal path 433 and a fourth signal path 434 having a relative phase shift of 180 degrees. Optionally, the second two interference sub-spectrums are configured to have a phase shift of 90 degrees relative to the first two interference sub-spectrums. The sub-spectrum in the third signal path 433 has a phase shift of 90 degrees off the sub-spectrum in the first signal path 431. The sub-spectrum in the fourth signal path 434 has a phase shift of 90 degrees off the sub-spectrum in the second signal path 432.

In a specific embodiment, each signal path of the two DLIs is terminated by a photodiode, PD1 441 through PD4 444 respectively for the four signal paths 431 through 434 for converting the signal intensity to a corresponding PD current. As a result, the intensity of each interference sub-spectrum can be represented by a PD current plotted in frequency domain. FIG. 7 is a plot of four normalized PD currents representing four phase-shifted interference sub-spectrums of the DLI in frequency domain according to an embodiment of the present invention. As shown, curve 1 and curve 3 are two PD currents, with their amplitude (intensity) being normalized with a reference intensity measured by the PD0 440 in the first path 421, representing two interfering sub-spectrums outputted from the MMI coupler 4302 of the first DLI 430A to set two target frequencies assigned to Laser 1 and Laser 3 at two quadrature points. Curve 2 and curve 4 are other two PD currents representing two interference sub-spectrums outputted from the MIMI coupler 4303 of the second DLI 430B to set two other target frequencies assigned to Laser 2 and Laser 4 at two other quadrature points. The two target frequencies assigned for Lasers 1 and 3 can be two DWDM channels selected from ITU grid having a channel spacing (e.g., 100 GHz spacing between Laser 1 and Laser 3). Curves 1 and 3 are interleaved with curves 2 and 4. The two target frequencies assigned for Lasers 2 and 4 can be two additional DWDM channels selected from ITU grid having a finer channel spacing (e.g., 50 GHz between Laser 1 and Laser 2 and between Laser 3 and Laser 4). In an alternative view, the FSR is equal to 4× of the finer channel spacing between two neighboring target frequencies which has been defined earlier as two times of the period of each interference wave (1, or 2, or 3, or 4) in frequency domain. Optionally, the target frequencies are selected from DWDM narrow-band channels at ITU grid with a channel spacing of 100 GHz, or 50 GHz, or 25 GHz, or 12.5 GHz. Optionally, the target frequencies are selected from two or more gridless channels.

Optionally, the first DLI 430A includes a resistive heater 4315 to adjust the group index associated with the waveguide material and help to tune the phase shift and central frequency position to maintain the quadrature points at the two target frequencies assigned for Laser 1 and Laser 3. Similarly, the second DLI 430B includes a resistive heater 4316 for achieving the same purpose to keep the corresponding quadrature points at two target frequencies assigned for Laser 2 and Laser 4. Optionally, each signal path is inserted a VOA, such as VOA1 461 for signal path 431, VOA2 462 for signal path 432, VOA3 463 for signal path 433, and VOA4 464 for signal path 434, for balancing the power in each signal path to eliminate possible signal fluctuation.

Figure 6:
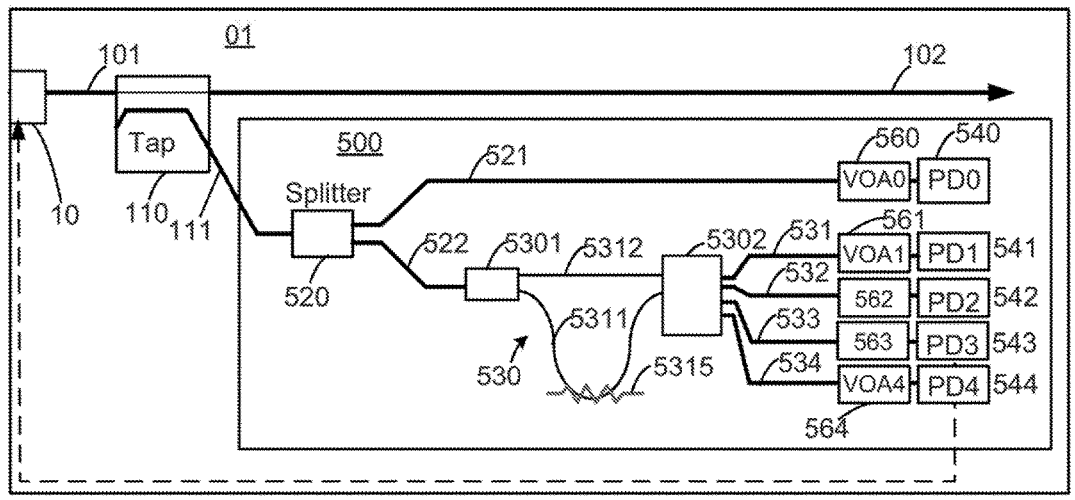
FIG. 6 is a simplified diagram of the wavelength locker including one DLI and a 2×4 MIMI coupler outputting four phase-shifted interference sub-spectrums according to another embodiment of the present invention.

In an alternative embodiment, the two DLIs in the wavelength locker 400 can be replaced by one DLI plus an optical hybrid coupler in a same waveguide-based wavelength locker for similar operations with channels in finer DWDM grid or gridless DWDM channels. FIG. 6 is a simplified diagram of the wavelength locker including one DLI and a 2×4 MMI coupler outputting four phase-shifted interference sub-spectrums according to another embodiment of the present invention. A 2×4 MMI coupler 5302 has each of the outputs at 90° phase offset. This diagram is merely an example, which should not unduly limit the scope of the claims. One of ordinary skill in the art would recognize many variations, alternatives, and modifications. As shown, the wavelength locker 500 includes a 1×2 power splitter 520 to split an input 111 to two paths with equal intensity, a first path 521 terminated by a photodiode PD0 540 to measuring the reference intensity and a second path 522 being guided to a DLI 530 via a MMI coupler 5301 into two waveguide arms. A first arm 5311 is set to be longer than the second arm 5312 to create a phase delay for generating an interference spectrum when the two paths are recombined at the 2×4 MMI coupler 5302. The 2×4 MMI coupler 5302 outputs four interference sub-spectrums respectively passed to four signal paths 531-534 having a relative phase shift of 90 degrees. These four interference sub-spectrums in frequency domain are substantially the same as the four interference sub-spectrums out of the two pairs of signal paths 431-432 of a first DLI 430A and 433-434 of a second DLI 430B shown in FIG. 5.

In an embodiment, the wavelength locker includes one DLI having a first arm and a second arm with a phase delay to induce an interference spectrum at a 2×N MMI coupler, wherein N is $2^n$ and n is natural number. The 2×N MMI coupler is configured to output N sub-spectrums respectively to N signal paths in same power with a relative $2\pi/N$ phase shift equal to 1/N of the free-spectral-range of the DLI. The N sub-spectrums cross each other to yield a plurality of quadrature points. The corresponding frequency at each quadrature point can be selected to be one target frequency. At each quadrature point, optical intensity of one sub-spectrum decreases with increasing frequency and optical intensity of the next sub-spectrum increases with increasing frequency. An error signal based on frequency differential at the quadrature yields a positive/negative sign change when the frequency crosses this duadrature point, making it easier to be detected and using the sign change as a feedback for locking transmission frequency at the target frequency defined by the quardrature point. Optionally, the wavelength locker includes a resistive heater disposed around the first arm of the DLI for tuning the interference spectrum in frequency domain to keep the quadrature points of the N sub-spectrums crossing each other respectively at one or more target frequencies.

Similar to the wavelength locker 400, the wavelength locker 500 also uses a photodiode to measure intensity of each interference sub-spectrum in each of the four signal paths, for example, PD1 541 for signal path 531, PD2 542 for signal path 532, PD3 543 for signal 533, and PD4 544 for signal path 534, to obtain a PD current. Accordingly, a plot of the four PD currents in the frequency domain is substantially the same as those shown in FIG. 7. As shown, each PD current curve is a sine wave and each next wave is 90 degrees delay in phase. The quadrature points are intersection points among the four sub-spectrums and are again tunable to match with the four target frequencies assigned respectively to the four lasers. Optionally, four frequencies corresponding to four nearest neighbored quadrature points are selected to be the four target frequencies. Referring to FIG. 7, the free-spectral-range FSR associated with the DLI 530 is configured to be 4× of the channel spacing between two neighboring target frequencies which can be just two neighboring channels in a DWDM ITU grid. Optionally, the target frequencies at the ITU grid have a channel spacing of 100 GHz, or 50 GHz, or 25 GHz, or 12.5 GHz. Optionally, the target frequencies are selected from two or more gridless channels. Optionally, any number of target frequencies can be selected from corresponding number of quadrature points and used for locking corresponding number of laser frequencies associated with the silicon photonics transmission system.

Optionally, the wavelength locker 500 includes a resistive heater 5315 disposed around the first arm 5311 of the DLI 530 for tuning the center wavelength and group index to ensure that the quadrature points align with the corresponding target frequencies against possible temperature drift. Once the laser frequency is off the assigned target frequency due to any reason such an environmental change or device aging, the wavelength locker is able to detect an error signal based on a differential value obtained from the PD currents measured by those photodiodes of 541-544 in the four signal paths of 531-534. The error signal can be used as a feedback signal sent to the laser diode in the silicon photonics transmission system 10 for retuning the laser frequency back to the corresponding target frequency. Optionally, each output signal path, including the first path 521 for providing a base signal for measuring a reference intensity and each signal path 531-534 for outputting an interference sub-spectrum, can be inserted a VOA to balance the power in each path to overcome any possible power fluctuation to ensure the error signal can be detected more accurately which in turn ensure the wavelengths can be locked to the target channels more accurately. The first path 521 is inserted a VOA0 560. Each of the signal paths 531-534 is inserted a VOA, such as VOS1 561 for signal path 531, VOA2 562 for signa path 532, VOA3 563 for signa path 533, and VOA4 564 for signa path 534.

In some embodiments, each of the wavelength lockers 200 of FIG. 2, 300 of FIG. 3, 400 of FIG. 5, and 500 of FIG. 6 is substantially similar to the wavelength locker 100 that is placed after light signal from the silicon photonics transmission system 10 is modulated and/or multiplexed. In some alternative embodiments, each of the wavelength lockers 200 of FIG. 2, 300 of FIG. 3, 400 of FIG. 5, and 500 of FIG. 6 is placed prior to the light signal being modulated and/or multiplexed. The advantage of post modulation and post optical multiplexing of a plurality of wavelengths is that only a single DLI is needed.

In some embodiments, the wavelength locker 100 of FIG. 1 or 200 of FIG. 2 is advantageous in application of locking wavelengths of dual-carrier transmission system. Optionally, as two or more wavelengths/frequencies are carried in the input signal 111. In order to distinguish different frequencies in the PD current and the error signal deduced from the PD currents from different signal paths out of the DLI 200, a distinguished dither frequency can be added to each different signal frequency. These dither frequencies can be added during signal modulation. As a result, the error signal can carry an ID-information about particular signal frequency that is off a corresponding target frequency. The feedback of this error signal via the control loop can be sent to corresponding laser diode that generates the identified signal and allow the laser diode to be tuned to provide corrected laser frequency.

Figure 9:
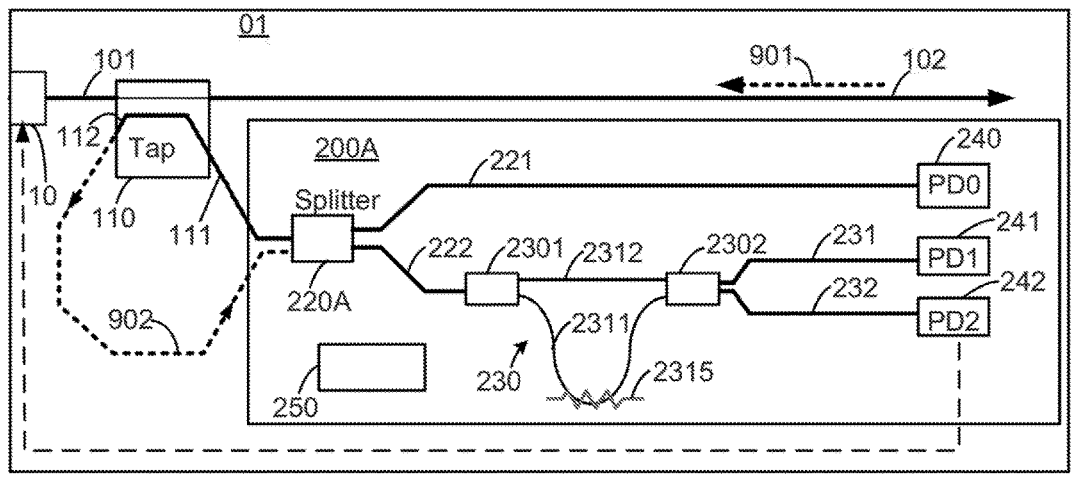
FIG. 9 is a simplified diagram of the wavelength locker of FIG. 2 with a calibration port according to an embodiment of the present invention.

In an alternative aspect, the wavelength locker disclosed throughout the specification above includes a calibration port that is able to, in addition to use internal light source from the lasers of the silicon photonics transmission system to calibrate the wavelength locker in current configuration, use an external light source with pre-calibrated target frequencies to calibrate the wavelength locker. In an example, FIG. 9 is a simplified diagram of the wavelength locker of FIG. 2 with a calibration port according to an embodiment of the present invention. As shown, an external light signal 901 with a know frequency to be set as a target frequency is sent via the primary output path 102 in reversed direction. This external light signal 901 is tapped down as a calibration signal by the cross tap port 112 of the power tap coupler 110. Through a waveguide 902, the calibration signal is guided to the splitter 220 as an input with half power as a reference and another half power for tuning the DLI 230 to properly set a corresponding quadrature point of the interference spectrum and output as two sub-spectrums measured in terms of two corresponding PD currents at the know target frequency. The calibrated wavelength locker 200A is able to perform wavelength locking function when receiving tapped transmission signal out of the silicon photonics transmission system 10 for accurately locking the corresponding laser frequency to the target frequency.

Figure 10:
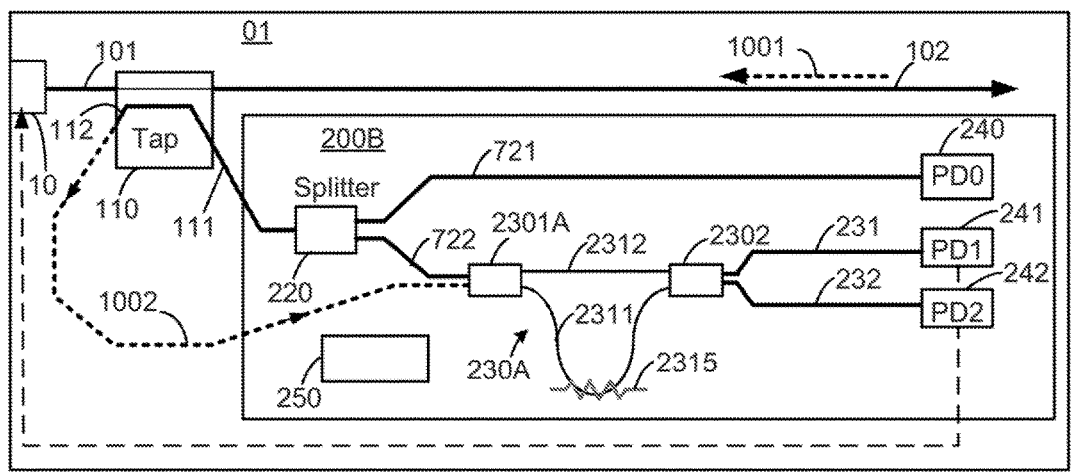
FIG. 10 is a simplified diagram of the wavelength locker of FIG. 2 with a calibration port according to another embodiment of the present invention.

In an alternative embodiment, an external light signal 1001 with a know frequency to be set as a target frequency is sent via the primary output path 102 in reversed direction, as shown in FIG. 10, but this external light signal 1001 is tapped down as a calibration signal by the cross tap port 112 of the power tap coupler 110 and guided via a waveguide 1002 to the MMI coupler 2301A with full power for tuning the DLI 230A to properly set a corresponding quadrature point of the interference spectrum and output as two sub-spectrums measured in terms of two corresponding PD currents at the know target frequency. The calibrated wavelength locker 200B is able to perform wavelength locking function when receiving tapped transmission signal out of the silicon photonics transmission system 10 for accurately locking the corresponding laser frequency to the target frequency.

In another alternative aspect, the present disclosure provides a silicon photonics transmission system integrating a wavelength locker with a transmitter on a single SOI substrate. The transmitter includes one or more DFB lasers for generating an optical signal multiplexed with one or more frequencies. The wavelength locker associated with the silicon photonics transmission system is substantially similar to one selected from the wavelength locker shown in any one of FIG. 1, FIG. 2, FIG. 3, FIG. 5, and FIG. 6. The wavelength locker is configured with a waveguide-based DLI utilizing a tapped transmission signal for generating an interference spectrum and outputting at least two sub-spectrums in respective at least two signal paths. The at least two sub-spectrums cross each other in frequency domain to yield a plurality of quadrature points at which one or more target frequencies selected from certain DWDM channels in ITU grid or gridless channels are assigned. Each signal path is terminated by a photodiode to detecting a photocurrent representing optical power varying with frequency. An error signal based on a differential photocurrent measured by all photodiodes respectively terminated at all signal paths is deduced as the frequencies generated by the one or more DFB lasers vary respectively around the one or more target frequencies set at corresponding quadrature points. The wavelength locker is sending the error signal as a feedback signal through a control loop to corresponding one or more laser diodes associated with the transmitter for tuning their operations for locking the one or more laser frequencies to respective desired one or more target frequencies selected from certain DWDM channels.

Optionally, the silicon photonics transmission system includes the wavelength locker disposed prior or after a signal modulation device and/or a multiplexer for combining two or more signals with different frequencies into one transmission signal. Optionally, the silicon photonics transmission system includes the wavelength locker substantially similar to one selected from the wavelength locker shown in FIG. 9 and FIG. 10, including a calibration port that is able to receive an external light signal with pre-calibrated target frequency for calibrating the DLI of the wavelength locker.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A wavelength locker integrated with a silicon photonics transmission system comprising:
    a silicon-on-insulator (SOI) substrate on which the silicon photonics transmission system is formed;
    a power tap coupler to receive a fraction of a transmission signal from the silicon photonics transmission system as an input signal with one or more frequencies;
    a splitter configured to split the input signal to a first signal in a first path and a second signal in a second path;
    a first delay-line-interferometer (DLI) coupled to the second path to receive the second signal and configured to generate an interference spectrum and output a first sub-spectrum and a second sub-spectrum shifted in frequency domain by half of a free-spectral-range to form a plurality of quadrature points at respective one or more target frequencies;
    a first detector coupled to the first path for detecting a reference power of the first signal; and
    a second detector and a third detector for respectively detecting a first power of the first sub-spectrum and a second power of the second sub-spectrum depended on frequency to generate an error signal fed back to the silicon photonics transmission system for locking the one or more frequencies at corresponding one or more target frequencies.

2. The wavelength locker of claim 1, wherein the power tap coupler is a waveguide device formed on the SOI substrate on which the silicon photonics transmission system is formed, wherein the transmission signal with the one or more frequencies is generated from respective one or more DFB lasers associated with the silicon photonics transmission system.

3. The wavelength locker of claim 1, wherein the splitter comprises a waveguide device formed on the SOI substrate and configured as a 1×2 power splitter so that the first signal and the second signal are substantially equal in power and each carries the at least two frequencies.

4. The wavelength locker of claim 1, further comprising a second DLI combined with the first DLI to commonly couple to the second path via a 1×4 multimode interference (MMI) coupler to receive the second signal, the first DLI being configured to split half power of the second signal into two waveguide arms configured with a first arm being longer than a second arm by a first predetermined length to generate a first interference spectrum with a first free-spectral-range equal to twice of a first channel spacing of a first set of channels, the second DLI being configured to split remaining half power of the second signal into two waveguide arms configured with a third arm being shorter than a fourth arm by a second predetermined length to generate a second interference spectrum with a second free-spectral-range equal to twice of a second channel spacing of a second set of channels, the second set of channels being interleaved with the first set of channels in frequency domain and the second channel spacing being equal to the first channel spacing.

5. The wavelength locker of claim 1, wherein the first detector comprises a first photodiode to detect a reference photocurrent for measuring the reference power of the first signal at the first path, and the second detector and the third detector respectively comprise a second photodiode and a third photodiode to detect a first signal photocurrent for measuring the first power of the first sub-spectrum and to detect a second signal photocurrent for measuring the second power of the second sub-spectrum, wherein each of the first signal photocurrent and the second signal photocurrent is normalized by the reference photocurrent to reduce power fluctuation among the signal photocurrents.

6. The wavelength locker of claim 1, further comprises a temperature sensor disposed on the SOI substrate for monitoring local temperature near the first DLI for guiding a tuning of the interference spectrum and calibrating the first DLI against thermal drift.

7. The wavelength locker of claim 1, wherein the power tap coupler is configured to receive a calibration signal sent reversely from the primary output path including one or more frequencies set to respective target frequencies, and configured to deliver a fraction of the calibration signal via a waveguide to the splitter into the first DLI for calibrating the first DLI.

8. The wavelength locker of claim 1, wherein the power tap coupler is configured to receive a calibration signal sent reversely from the primary output path including one or more frequencies set to respective target frequencies, and configured to deliver a fraction of the calibration signal via a waveguide directly to a 2×2 MMI coupler into the first DLI for calibrating the first DLI.

9. A silicon photonics transmission system comprises one or more DFB lasers to output a transmission signal mixed with one or more frequencies to an output port, a power tap coupler coupled to the output port to provide a primary output path for outputting the transmission signal and a secondary path for providing a fraction of the transmission signal as an input signal to a wavelength locker of claim 1 for locking corresponding one or more laser frequencies of the one or more DFB lasers to respective one or more target frequencies.

10. The wavelength locker of claim 2, wherein the one or more target frequencies comprise one or more DWDM channels at ITU grid or one of multiple gridless channels having a channel spacing selected from 100 GHz, 50 GHz, 25 GHz, and 12.5 GHz.

11. The wavelength locker of claim 4, wherein the first DLI comprises a first 2×2 MMI coupler to output first two sub-spectrums of the first interference spectrum respectively to first two signal paths substantially in same power with a shifted phase of π equal to half of the first free-spectral range and a first resistive heater disposed around the first arm for tuning the first interference spectrum to keep a first set of quadrature points respectively at corresponding frequencies of the first set of channels, and the second DLI comprises a second 2×2 MMI coupler to output second two sub-spectrums of the second interference spectrum respectively to second two signal paths substantially in same power with a shifted phase of 7C equal to half of the second free-spectral range and a second resistive heater disposed around the fourth arm for tuning the second interference spectrum to keep a second set of quadrature points respectively at corresponding frequencies of the second set of channels.

12. The wavelength locker of claim 5, wherein the first signal photocurrent and the second signal photocurrent vary with frequency having opposite sign in frequency differential at each quadrature point.

13. The wavelength locker of claim 5, further comprises one variable optical attenuator (VOA) disposed in the first path and each of the two signal paths for balancing each of the first signal photocurrent and the second signal photocurrent.

14. The silicon photonics transmission system of claim 9, wherein the one or more target frequencies comprise DWDM channels of ITU grid or gridless channels having a channel spacing selected from 100 GHz, 50 GHz, 25 GHz, and 12.5 GHz.

15. The silicon photonics transmission system of claim 9, further comprises a modulator disposed prior to the output port before coupled to the power tap coupler.

16. The silicon photonics transmission system of claim 9, further comprises a multiplexer prior to the output port before coupled to the power tap coupler.

17. The wavelength locker of claim 10, wherein the error signal is a ratio of a difference over a sum of the first power and the second power, the sum is normalized against the reference power, and each of the one or more frequencies is locked to a target frequency by tuning the DFB lasers based on a change of sign of the error signal.

18. The wavelength locker of claim 10, wherein the first DLI comprises a waveguide device having two arms formed on the SOI substrate, an 1×2 multimode interference (MMI) coupler to split the second signal into the two arms configured with a first arm being longer than a second arm by a predetermined length to generate the interference spectrum with a free-spectral-range equal to twice of the channel spacing.

19. The wavelength locker of claim 11, wherein the first set of channels comprises DWDM channels at ITU grid or multiple gridless channels having a channel spacing of 100 GHz or 50 GHz, the second set of channels comprises DWDM channels at ITU grid or multiple gridless channels having a channel spacing of 100 GHz or 50 GHz, the second set of channels are shifted from corresponding first set of channels by 50 GHz or 25 GHz.

20. The wavelength locker of claim 18, wherein the first DLI further comprises a 2×2 MMI coupler to output the first sub-spectrum and the second sub-spectrum respectively to two signal paths substantially in same power with a relative phase shift equal to half of the free-spectral range, and a resistive heater disposed around the first arm for tuning the interference spectrum in frequency domain to keep the quadrature points of the first sub-spectrum crossing the second sub-spectrum respectively at the one or more target frequencies.

21. The wavelength locker of claim 18, wherein the first DLI alternatively comprises a 2×4 MMI coupler to output four sub-spectrums respectively to four signal paths substantially in same power with a relative $\pi/2$ phase shift equal to one-fourth of the free-spectral-range, and a resistive heater disposed around the first arm for tuning the interference spectrum in frequency domain to keep the quadrature points of the four sub-spectrums crossing each other respectively at one or more target frequencies.

22. The wavelength locker of claim 18, wherein the first DLI alternatively comprises a 2×N MMI coupler, wherein N is $2^n$ and n is natural number, to output N sub-spectrums respectively to N signal paths in same power with a relative $2\pi/N$ phase shift equal to 1/N of the free-spectral-range, and a resistive heater disposed around the first arm for tuning the interference spectrum in frequency domain to keep the quadrature points of the N sub-spectrums crossing each other respectively at one or more target frequencies.

* * * * *